US010948541B2

(12) United States Patent
Shin et al.

(10) Patent No.: US 10,948,541 B2
(45) Date of Patent: Mar. 16, 2021

(54) SYSTEM FOR DIAGNOSING SWITCHING ELEMENT SELECTIVELY CONNECTING Y-CAPACITORS TO GROUND

(71) Applicants: Hyundai Motor Company, Seoul (KR); Kia Motors Corporation, Seoul (KR)

(72) Inventors: Ho Joon Shin, Gyeonggi-do (KR); Nam Koo Han, Gyeonggi-do (KR); Sang Yoo Lee, Seoul (KR); Heon Young Kwak, Gyeonggi-do (KR); Hong Geuk Park, Chungcheongnam-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/654,289

(22) Filed: Oct. 16, 2019

(65) Prior Publication Data
US 2020/0341061 A1     Oct. 29, 2020

(30) Foreign Application Priority Data

Apr. 23, 2019   (KR) .................. 10-2019-0047387

(51) Int. Cl.
*G01R 31/02*     (2006.01)
*G01R 31/327*    (2006.01)
*B60L 53/22*     (2019.01)
*B60L 53/62*     (2019.01)
*B60L 3/00*      (2019.01)

(52) U.S. Cl.
CPC ........ *G01R 31/3274* (2013.01); *B60L 3/0069* (2013.01); *B60L 53/22* (2019.02); *B60L 53/62* (2019.02)

(58) Field of Classification Search
CPC ............ G01R 31/3272; G01R 31/3274; G01R 31/3277; G01R 31/3278; G01R 31/02; G01R 31/40; G01R 31/3336; G01R 19/18; G01R 19/252
See application file for complete search history.

(56) References Cited

U.S. PATENT DOCUMENTS

| 10,651,758 B2* | 5/2020 | Horikoshi | ........... H02M 5/4585 |
| 2014/0002104 A1* | 1/2014 | Yang | ....................... G01R 31/42 |
| | | | 324/548 |
| 2019/0067932 A1* | 2/2019 | Li | ........................... H02M 1/08 |
| 2019/0238050 A1* | 8/2019 | Jimichi | ............. H02M 3/33592 |

FOREIGN PATENT DOCUMENTS

| JP | 4822025 B2 | 11/2011 |
| JP | 6370492 B2 | 8/2018 |
| KR | 20000046871 A | 7/2000 |
| KR | 20120079261 A | 7/2012 |

* cited by examiner

*Primary Examiner* — Thang X Le
(74) *Attorney, Agent, or Firm* — Mintz Levin Cohn Ferris Glovsky and Popeo, P.C.; Peter F. Corless

(57) ABSTRACT

A system for diagnosing switching element selectively connecting Y-capacitors to ground is provided. The state of a switching device in a power conversion circuit is adjusted such that voltages of different levels are applied to the Y-capacitors, respectively. Therefore, a Y-capacitor disconnect switch which connects a plurality of Y-capacitors connected in common to a DC link to chassis ground is diagnosed.

12 Claims, 5 Drawing Sheets

SYSTEM FOR DIAGNOSING SWITCHING ELEMENT SELECTIVELY CONNECTING Y-CAPACITORS TO GROUND

CROSS-REFERENCE TO RELATED APPLICATION

This application claims the priority benefit of Korean Patent Application No. 10-2019-0047387, filed on Apr. 23, 2019, the disclosure of which is incorporated herein by reference.

BACKGROUND

1. Field of the Invention

The present invention relates to a system for diagnosing switching element selectively connecting Y-capacitors to ground, and more particularly to a system for diagnosing switching element selectively connecting Y-capacitors to ground in which voltages of different levels are applied respectively to a pair of Y-capacitors, to diagnose a fault of the switching element, which selectively connects a connection node of the pair of Y-capacitors to the ground.

2. Description of the Related Art

Recently, an on-board charger mounted within an electric vehicle or a plug-in hybrid vehicle has been implemented as a non-isolated type in which a transformer occupying a significant portion of volume and cost is excluded. Such a non-isolated charger has an advantage in terms of curtailment of cost, but may cause a current leakage between a system and a vehicle due a transformer providing electrical isolation being excluded.

To address a safety issue, external charging facilities have been designed to stop charging when current leakage of more than a predetermined amount is generated. In addition, as one of methods of reducing current leakage within a vehicle, a method may be considered which reduces an equivalent leakage impedance and, in turn, current leakage by electrically isolating Y-capacitors provided in various electric components in a power system within the vehicle from ground.

Additionally, to electrically isolate Y-capacitors from ground, there is an additional need for switching element for selectively connecting/disconnecting the Y-capacitors to/from the ground. When the switching element is additionally provided in this manner, an additional algorithm is also required to diagnose whether the switching element is operated normally.

Typically, the diagnosis of the switching element may be performed by providing a control signal for opening/closing of the switching element to the switching element and then comparing voltages at both terminals of the switching element to obtain a difference between those voltages. For example, when the voltages at both the terminals of the switching element are the same after the control signal for the opening of the switching element is provided, it may be diagnosed that a closing fault has occurred in the switching element. When the voltages at both the terminals of the switching element are different after the control signal for the closing of the switching element is provided, it may be diagnosed that an opening fault has occurred in the switching element.

However, when a pair of Y-capacitors are provided in each of a plurality of electric components connected in common to a direct current (DC) link of a vehicle, both the terminals of the switching element may be connected to connection nodes of the Y-capacitor pairs provided in the respective electric components, and thus may always be applied with a divided version of a DC link voltage irrespective of the opening/closing of the switching element. Accordingly, the voltages at both the terminals of the switching element may always be constant irrespective of the opening/closing of the switching element, thereby making it impossible to diagnose the switching element as stated above.

It will be understood that the above matters described in the related art are merely for promotion of understanding of the background of the invention and should not be recognized as prior art well-known to those skilled in the art.

SUMMARY

Therefore, the present invention provides a system for diagnosing switching element selectively connecting Y-capacitors to ground in which voltages of different levels are applied respectively to a pair of Y-capacitors, thereby making it possible to diagnose a fault of the switching element, which selectively connects a connection node of the pair of Y-capacitors to the ground.

In accordance with the present invention, a system for diagnosing switching element selectively connecting Y-capacitors to ground may include a first Y-capacitor group having a first capacitor and a second capacitor connected in series between a positive terminal and a negative terminal of a direct current (DC) link, a second Y-capacitor group having a third capacitor and a fourth capacitor connected in series between the positive terminal and negative terminal of the DC link, a Y-capacitor disconnect switch having one terminal (e.g., a first terminal) connected to a connection node of the first capacitor and second capacitor and the other terminal (e.g., a second terminal) connected to a connection node of the third capacitor and fourth capacitor, one of the first and second terminals being connected to the ground, a power conversion circuit connected to the DC link, the power conversion circuit having a switching device and configured to determine a DC voltage of the DC link by on/off of the switching device, and a controller configured to adjust a state of the switching device in the power conversion circuit to form different voltages at both the terminals of the Y-capacitor disconnect switch, and then control a disconnection operation state of the Y-capacitor disconnect switch and diagnose whether a fault has occurred in the Y-capacitor disconnect switch, based on the voltages at both the terminals of the Y-capacitor disconnect switch.

The power conversion circuit may include a bridge circuit having a plurality of legs. Each of the legs may include an upper switching device and a lower switching device connected in series. Each of the legs may be connected to the DC link. In other words, a first end of the legs may be connected to the positive terminal of the DC link and a second end may be connected to the negative terminal of the DC link. The controller, in a diagnosis mode of the Y-capacitor disconnect switch, may be configured to operate the upper switching device and lower switching device in each of the legs of the bridge circuit to enter different states to form different voltages at the series-connected capacitors in the first Y-capacitor group or second Y-capacitor group.

The first Y-capacitor group may be connected to an output stage of the power conversion circuit, and the first terminal of the Y-capacitor disconnect switch and the connection node of the first capacitor and second capacitor may be directly connected to the ground. The controller, in a diagnosis mode of the Y-capacitor disconnect switch, may be configured to operate the switching device of the power conversion circuit to adjust voltages applied respectively to the first capacitor and the second capacitor to different levels.

The power conversion circuit may be a non-isolated charger, the charger may be configured to convert alternating current (AC) power into DC power and provide the converted DC power as power for charging of a battery connected to the DC link. The controller may be configured to adjust states of a plurality of switching devices in the non-isolated charger to adjust voltages applied to the series-connected capacitors in the first or second Y-capacitor group to different levels.

The non-isolated charger may include a first switching device and a second switching device connected in series to form a first leg, and a third switching device and a fourth switching device connected in series to form a second leg. A first terminal of an input stage receiving the AC power may be connected to a connection node of the first switching device and second switching device, a second terminal of the input stage may be connected to a connection node of the third switching device and fourth switching device, and the DC voltage may be applied between a connection node of the first switching device and the third switching device and a connection node of the second switching device and the fourth switching device.

The system may further include a filter having a fifth capacitor and a sixth capacitor connected in series between both the terminals of the input stage receiving the AC power and connected to the connection node of the first capacitor and second capacitor at a connection node thereof, a first inductor connected between the first terminal of the input stage receiving the AC power and the connection node of the first switching device and second switching device, and a second inductor connected between the second terminal of the input stage and the connection node of the third switching device and fourth switching device, and a DC link capacitor connected between the positive terminal and negative terminal of the DC link. The controller, in a diagnosis mode of the Y-capacitor disconnect switch, may be configured to operate the first switching device and third switching device to be closed and the second switching device and fourth switching device to be open, or operate the first switching device and third switching device to be open and the second switching device and fourth switching device to be closed.

Alternatively, the power conversion circuit may be an inverter, the inverter may be configured to convert the DC voltage into AC power having a plurality of phases and provide the converted AC power to respective phases of a motor, or convert a level of a DC voltage applied to a neutral point of the motor and apply the level-converted DC voltage to the DC link. The controller may be configured to adjust states of a plurality of switching devices in the inverter to form the different voltages at both the terminals of the Y-capacitor disconnect switch.

The inverter may include a fifth switching device and a sixth switching device connected in series between the positive terminal and negative terminal of the DC link to form a first leg, a seventh switching device and an eighth switching device connected in series between the positive terminal and negative terminal of the DC link to form a second leg, and a ninth switching device and a tenth switching device connected in series between the positive terminal and negative terminal of the DC link to form a third leg.

An end of each of the fifth switching device, seventh switching device and ninth switching device may be connected to one of the positive terminal and negative terminal of the DC link, one end of each of the sixth switching device, eighth switching device and tenth switching device may be connected to the other one of the positive terminal and negative terminal of the DC link, a connection node of the fifth switching device and sixth switching device may be connected to a first of the phases of the motor, a connection node of the seventh switching device and eighth switching device may be connected to a second of the phases of the motor, and a connection node of the ninth switching device and tenth switching device may be connected to a third of the phases of the motor.

The system may further include a neutral-point capacitor configured to apply a DC voltage of external DC power to the neutral point of the motor, and a seventh capacitor and an eighth capacitor connected in series across the neutral-point capacitor and connected to the connection node of the third capacitor and fourth capacitor at a connection node thereof. The controller, in a diagnosis mode of the Y-capacitor disconnect switch, may be configured to operate the fifth switching device, seventh switching device and ninth switching device to be closed and the sixth switching device, eighth switching device and tenth switching device to be open, or operate the fifth switching device, seventh switching device and ninth switching device to be open and the sixth switching device, eighth switching device and tenth switching device to be closed.

The controller, in a diagnosis mode of the Y-capacitor disconnect switch, may form the different voltages at both the terminals of the Y-capacitor disconnect switch, and then diagnose that an opening fault has occurred in the Y-capacitor disconnect switch when the voltages at both the terminals of the Y-capacitor disconnect switch are different under the condition of providing a control signal for operating the Y-capacitor disconnect switch to be turned on, to the switch, and diagnose that a closing fault has occurred in the Y-capacitor disconnect switch when the voltages at both the terminals of the Y-capacitor disconnect switch are the same under the condition of providing a control signal for operating the Y-capacitor disconnect switch to be turned off, to the switch.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Reference will now be made in detail to the exemplary embodiments of the present invention, examples of which are illustrated in the accompanying drawings. Wherever possible, the same reference numbers will be used throughout the drawings to refer to the same or like parts.

Figure 1:
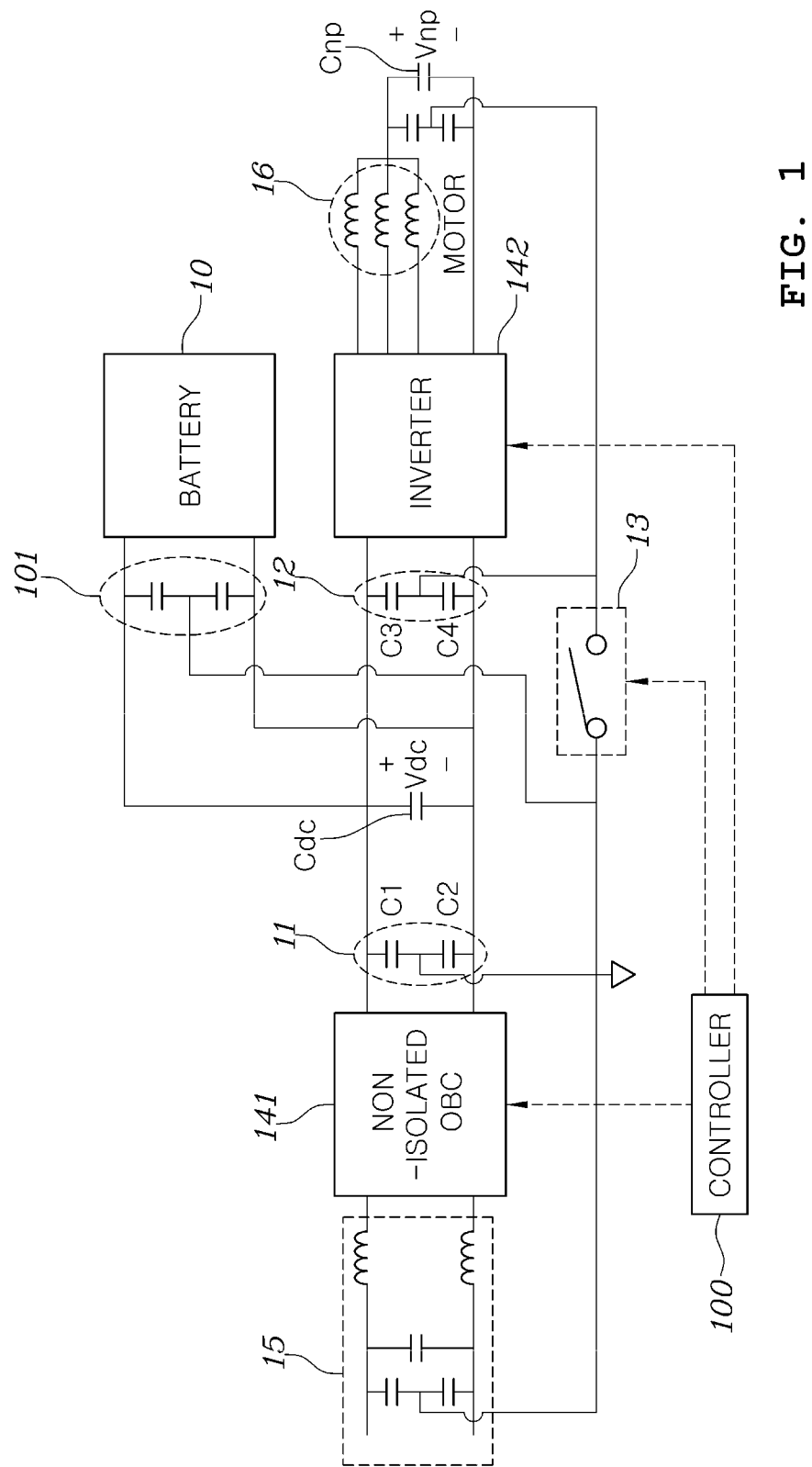
FIG. 1 is a block diagram showing the configuration of a system for diagnosing switching element selectively connecting Y-capacitors to ground, according to an exemplary embodiment of the present invention.

FIG. 1 is a block diagram showing the configuration of a system for diagnosing switching element selectively connecting Y-capacitors to ground, according to an exemplary embodiment of the present invention. In particular, FIG. 1 shows an example applied to a high-voltage electric system which may include an on-board charger, an inverter, a motor and a battery applied to an electric vehicle or a plug-in hybrid vehicle, to generate driving force of the vehicle.

Referring to FIG. 1, the switching element diagnosis system according to the present embodiment may include a first Y-capacitor group 11 having a first capacitor C1 and a second capacitor C2 connected in series between a positive (+) terminal and a negative (−) terminal of a direct current (DC) link to which a DC voltage Vdc is applied, a second Y-capacitor group 12 having a third capacitor C3 and a fourth capacitor C4 connected in series between the positive terminal and negative terminal of the DC link, and a switch 13 having a first terminal connected to a connection node of the first capacitor C1 and second capacitor C2 and a second terminal connected to a connection node of the third capacitor C3 and fourth capacitor C4. One of the first terminal and the second terminal of the switch 13 may be connected to the ground.

The switching element diagnosis system may further include power conversion circuits 141 and 142 connected to the DC link and each including a plurality of switching devices. Each of the power conversion circuits 141 and 142 may form or convert the DC voltage Vdc of the DC link by on/off of the switching devices. The switching element diagnosis system may further include a controller 100 configured to adjust the states of the switching devices in each of the power conversion circuits 141 and 142 to, when the switch 13 is in its open state, form different voltages at both the terminals of the switch 13 and then diagnose whether a fault has occurred in the switch 13.

As shown in FIG. 1, Y-capacitor groups 11 and 12 including two capacitors connected in series may be connected in common to the DC link at which the DC voltage Vdc is formed. The DC link is formed by a DC link capacitor Cdc, and a voltage across the DC link capacitor Cdc is the DC voltage Vdc. A first end of the DC link capacitor Cdc at which a high potential is formed may be the positive (+) terminal of the DC link, and a second end of the DC link capacitor Cdc at which a low potential is formed may be the negative (−) terminal of the DC link. In the example of FIG. 1, the first Y-capacitor group 11 may be provided to remove a high-frequency noise component of power output from an output stage of a non-isolated on-board charger (OBC) 141, and the second Y-capacitor group 12 may be provided to remove a high-frequency noise component of power input to an inverter 142. The two Y-capacitor groups 11 and 12 may be connected between the positive terminal and negative terminal of the DC link.

The DC voltage Vdc may be formed by a battery 10 connected to the DC link. A Y-capacitor group 101 for removal of a high-frequency noise component may also be connected to terminals of the battery 10. In description of various exemplary embodiments of the present invention, a Y-capacitor group refers to a circuit structure in which a pair of capacitors connected in series are included and a connection node thereof is connected to grounding component such as a chassis of the vehicle. Some of Y-capacitor groups may always be connected to the grounding component, and others thereof may be connected or isolated to or from the grounding component by the switch 13 as needed.

The switch 13 may be configured to determine an electrical connection state between a connection node of a pair of capacitors in at least one of the Y-capacitor groups and the grounding component. For example, in the example of FIG. 1, the switch 13 may be connected between the connection node of the two capacitors C3 and C4 in the second Y-capacitor group 12 and the grounding component. Of course, since the connection node of the two capacitors C1 and C2 in the first Y-capacitor group 11 is always connected to the grounding component, both the terminals of the switch 13 may be connected to the connection nodes of the capacitor pairs in the two Y-capacitor groups, respectively.

In various exemplary embodiments of the present invention, the first Y-capacitor group 11 and the second Y-capacitor group 12 may be connected in common to the DC link formed by the DC link capacitor Cdc, as shown in FIG. 1, and the capacitors forming each Y-capacitor group 11 or 12 have the same values. Accordingly, when the non-isolated OBC 141 or the inverter 142 is not operated and the switch 13 is in an open state, the voltages at both the terminals of the switch 13 equally have a value of ½ of the DC voltage Vdc. As a result, it may be impossible to diagnose whether a fault has occurred in the switch 13, through voltage variations at both the terminals of the switch 13 based on opening/closing of the switch 13.

Therefore, in various exemplary embodiments of the present invention, the diagnosis of the switch 13 provided between the Y-capacitors and the chassis ground may be executed after the states of the switching devices in the power conversion circuits (for example, the non-isolated OBC 141 and the inverter 142) connected to the DC link together with the Y-capacitors are operated such that voltages applied to the Y-capacitors have values different from ½ of the DC voltage Vdc of the DC link.

The controller 100 may be configured to perform calculation and determination for the diagnosis of the switch 13, and may be implemented in the form of various microcomputers within the vehicle. In various exemplary embodiments of the present invention, in the diagnosis of the switch 13, the controller 100 may be configured to diagnose whether a fault has occurred in the switch 13 by turning the switching devices on/off in the power conversion circuits 141 and 142 to adjust the voltages applied to both the terminals of the switch 13 to different values and then may be configured to output a control signal for adjustment of the state of the switch 13 to the switch 13.

A description will hereinafter be given of a method of diagnosing the state of the switch 13 by operating the non-isolated OBC 141, among various exemplary embodiments of the present invention. The non-isolated OBC 141 is a type of power conversion circuit that includes a switching device and converts external alternating current (AC) power through on/off control (pulse width modulation control) of the switching device to output DC power capable of charging the battery 10. The non-isolated OBC 141 is an apparatus which does not employ a transformer for isolation between input and output stages therein, and may be implemented in various forms of topologies known in the art. In particular, the non-isolated OBC 141 applied to the present invention may have a bridge circuit including a plurality of switching devices.

Figure 2:
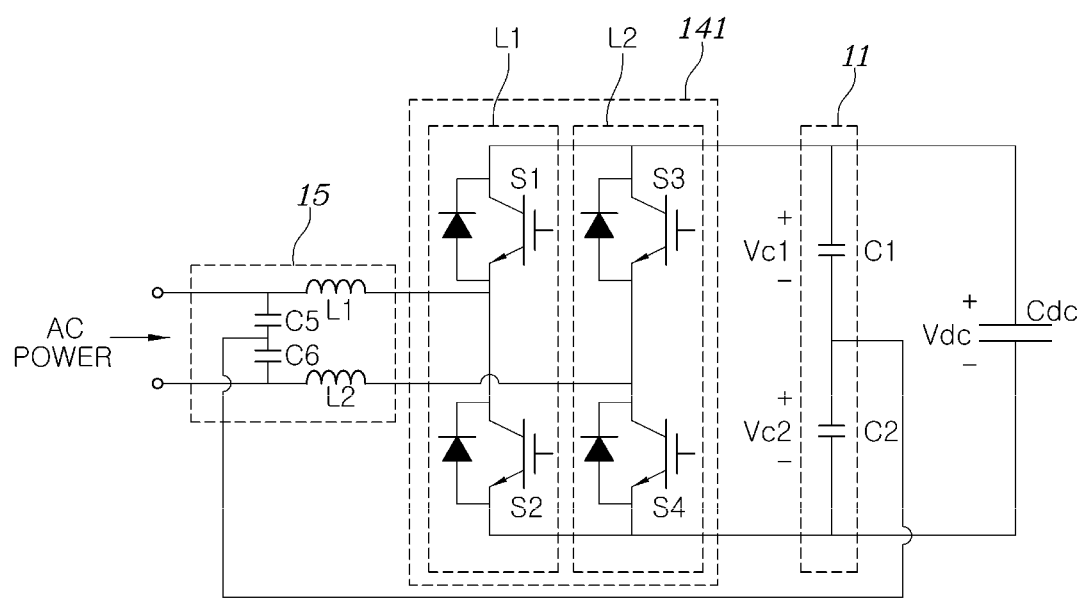
FIG. 2 is a detailed circuit diagram of an example of a non-isolated on-board charger (OBC) applied to a system for diagnosing switching element selectively connecting Y-capacitors to ground, according to an exemplary embodiment of the present invention.

FIG. 2 is a detailed circuit diagram of an example of a non-isolated OBC applied to a system for diagnosing switching element selectively connecting Y-capacitors to ground, according to an exemplary embodiment of the present invention. Referring to FIG. 2, the non-isolated OBC 141 applied to the switching element diagnosis system according to the present exemplary embodiment may be implemented with a bridge circuit including a plurality of switching devices S1 to S4.

In particular, the non-isolated OBC 141 may include a first switching device S1 and a second switching device S2 connected in series to form a first leg LEG1, and a third switching device S3 and a fourth switching device S4 connected in series to form a second leg LEG2. A first terminal of an input stage to which external AC power is input may be connected to a connection node of the first switching device S1 and second switching device S2, and a second terminal of the input stage to which the external AC power is input may be connected to a connection node of the third switching device S3 and fourth switching device S4. The DC voltage Vdc may be applied between a connection node of the first switching device S1 and third switching device S3 and a connection node of the second switching device S2 and fourth switching device S4.

A common mode filter 15 including Y-capacitors C5 and C6 and inductors L1 and L2 may be disposed between a stage upstream from the non-isolated OBC 141, namely, the input stage to which the external AC power is input, and the non-isolated OBC 141. The first Y-capacitor group 11 and the DC link capacitor Cdc, which form the DC voltage Vdc of the DC link, may be connected between the connection node of the first switching device S1 and third switching device S3 and the connection node of the second switching device S2 and fourth switching device S4. Particularly, the two nodes form the output stage of the non-isolated OBC 141. Since a connection node of the Y-capacitors C5 and C6 provided in the common mode filter 15 and the connection node of the capacitors C1 and C2 forming the first Y-capacitor group 11 are connected in common to the chassis ground, they are electrically connected to each other.

When the diagnosis of the switch 13 is started, the controller 100 may be configured to operate the first switching device S1 and third switching device S3 among the switching devices of the non-isolated OBC 141 to be closed and the second switching device S2 and fourth switching device S4 thereamong to be open, or, conversely, operate the first switching device S1 and third switching device S3 to be open and the second switching device S2 and fourth switching device S4 to be closed. In other words, the upper switching devices of the respective legs LEG1 and LEG2 and the lower switching devices thereof may be operated separately to enter different states.

Figure 3:
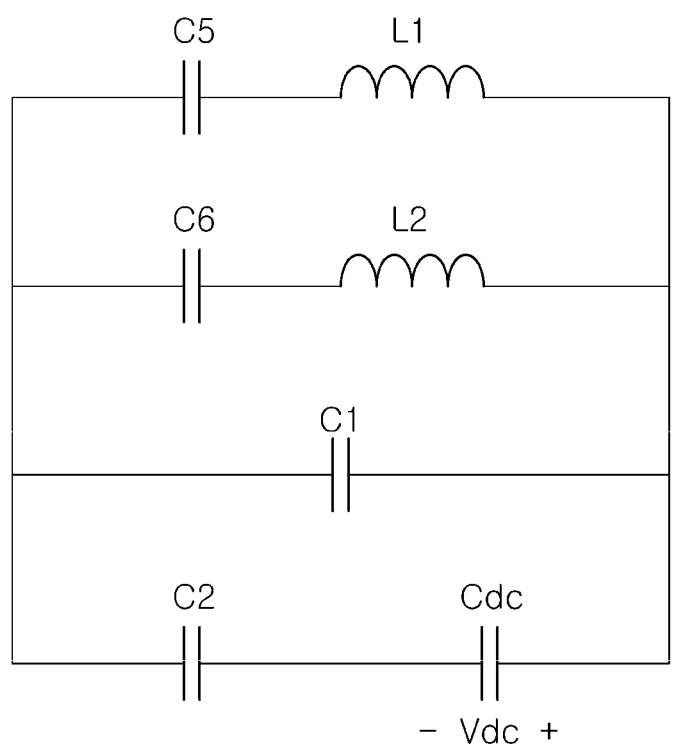
FIG. 3 is a circuit diagram of a circuit formed when first and third switching devices among switching devices of the non-isolated OBC in FIG. 2 are controlled to be closed and second and fourth switching devices thereamong are controlled to be open according to an exemplary embodiment of the present invention.

FIG. 3 is a circuit diagram of a circuit formed when the first and third switching devices among the switching devices of the non-isolated OBC in FIG. 2 are controlled to be closed and the second and fourth switching devices thereamong are controlled to be open. As shown in FIG. 3, when the controller 100 operates the first switching device S1 and the third switching device S3 to be closed and the second switching device S2 and the fourth switching device S4 to be open, different voltages are applied to the first capacitor C1 and second capacitor C2 included in the first Y-capacitor group 11 by connection with the capacitors and inductors forming the common mode filter upstream of the non-isolated OBC 141.

On the other hand, the DC voltage Vdc of the DC link may be directly applied to the third capacitor C3 and fourth capacitor C4 included in the second Y-capacitor group 12, so that the voltage of the fourth capacitor C4 has a value of ½ of the DC voltage Vdc. Since the voltage of the second capacitor C2 may be applied to the first terminal of the switch 13 and the voltage of the fourth capacitor C4 may be applied to second terminal of the switch 13, the voltages at both the terminals of the switch 13 have different values.

Accordingly, the controller 100 may be configured to operate the switching devices S1 to S4 in the non-isolated OBC 141 such that the voltages applied to the capacitors C1 and C2 of the first Y-capacitor group 11 have different values, to adjust the voltages at both the terminals of the switch 13 to different values. Thereafter, the controller 100 may be configured to output a control signal for operating the switch 13 to be open, to the switch 13, and then may be configured to measure the voltages at both the terminals of the switch 13. When the voltages at both the terminals of the switch 13 are the same, the controller 100 may be configured to determine that the switch 13 fails to be open, and thus diagnose that a closing fault has occurred in the switch 13.

In addition, the controller 100 may be configured to output a control signal for operating the switch 13 to be closed, to the switch 13, and then may be configured to measure the voltages at both the terminals of the switch 13. When the voltages at both the terminals of the switch 13 are different, the controller 100 may be configured to determine that the switch 13 fails to be closed, and thus diagnose that an opening fault has occurred in the switch 13.

Moreover, a description will be provided of a method of diagnosing the state of the switch 13 by operating the inverter 142, among various exemplary embodiments of the present invention. The inverter 142 is a power conversion circuit that may include a switching device and may be configured to convert DC power of the DC link through on/off control (pulse width modulation control) of the switching device into three-phase AC power and provide the converted AC power to a motor 16.

Figure 4:
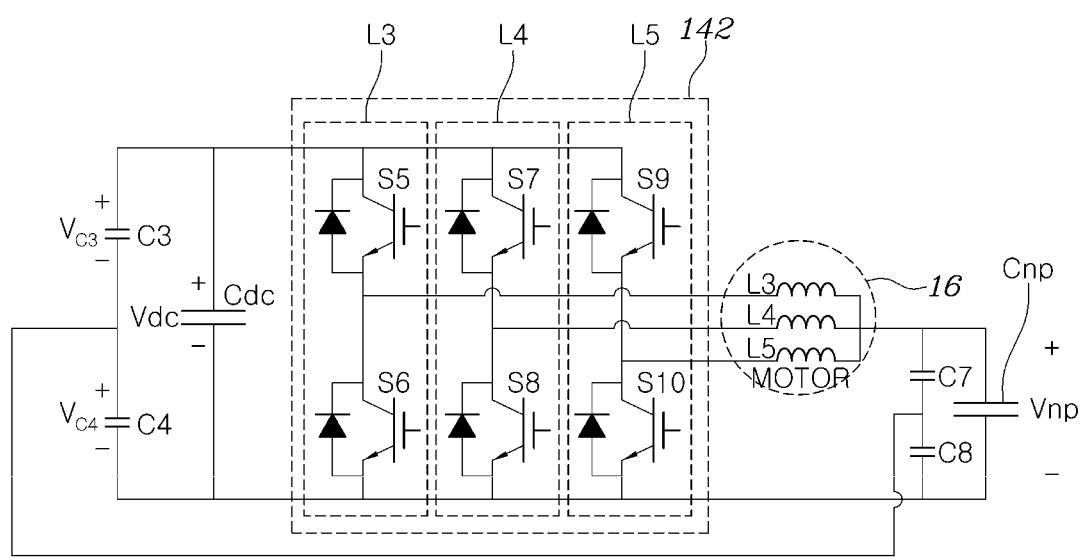
FIG. 4 is a detailed circuit diagram of an example of an inverter applied to a system for diagnosing switching element selectively connecting Y-capacitors to ground, according to an exemplary embodiment of the present invention.

FIG. 4 is a detailed circuit diagram of an example of an inverter applied to a system for diagnosing switching element selectively connecting Y-capacitors to ground, according to an exemplary embodiment of the present invention. Referring to FIG. 4, the inverter 142 may include three legs LEG3 to LEG5 each including two switching devices connected in series. The end of the legs LEG3 to LEG5 may be connected to the positive terminal and negative terminal of the DC link, respectively. Connection nodes between the switching devices in the respective legs LEG3 to LEG5 may be connected to corresponding phases of the motor 16, respectively. In other words, the connection node of the two switching devices S5 and S6 in the leg LEG3 may be connected to a first phase of the motor 16, the connection node of the two switching devices S7 and S8 in the leg LEG4 may be connected to a second phase of the motor 16, and the connection node of the two switching devices S9 and S10 in the leg LEG5 may be connected to a third phase of the motor 16.

On the other hand, the motor 16 may be expressed as an equivalent circuit of three inductors L3 to L5 connected to a neutral point of the motor 16, as shown in FIG. 4. Particularly, the inverter 142 may be operated as a charger configured to receive an external DC voltage Vnp through the neutral point of the motor 16, convert the received DC voltage Vnp using the inductors L3 to L5 of the motor 16 and the switching devices S5 to S10 of the inverter 142 and then provide the converted voltage to the DC link to charge the battery 10. To embody a charging system using the neutral point of the motor 16, a capacitor Cnp which forms a DC voltage at the neutral point and a Y-capacitor group which includes a pair of capacitors C7 and C8 connected in series across the capacitor Cnp may be connected to the neutral point of the motor 16.

When the diagnosis of the switch 13 is started, the controller 100 may be configured to operate the upper switching devices S5, S7 and S9 of the respective legs LEG3 to LEG5 among the switching devices of the inverter 142 to be closed and the lower switching devices S6, S8 and S10 of the respective legs LEG3 to LEG5 thereamong to be open, or, conversely, operate the upper switching devices S5, S7 and S9 of the respective legs LEG3 to LEG5 to be open and the lower switching devices S6, S8 and S10 of the respective legs LEG3 to LEG5 to be closed.

Figure 5:
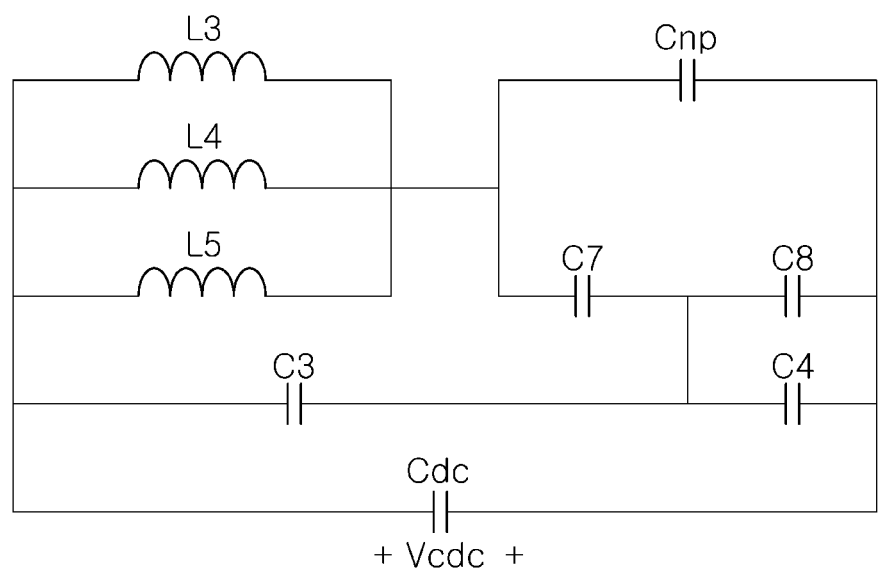
FIG. 5 is a circuit diagram of a circuit formed when upper switching devices of respective legs among switching devices of the inverter in FIG. 4 are controlled to be closed and lower switching devices of the respective legs thereamong are controlled to be open according to an exemplary embodiment of the present invention.

FIG. 5 is a circuit diagram of a circuit formed when the upper switching devices of the respective legs among the switching devices of the inverter in FIG. 4 are controlled to be closed and the lower switching devices of the respective legs thereamong are controlled to be open. As shown in FIG. 5, when the controller 100 operates the upper switching devices S5, S7 and S9 of the respective legs LEG3 to LEG5 to be closed and the lower switching devices S6, S8 and S10 of the respective legs LEG3 to LEG5 to be open, different voltages may be applied to the third capacitor C3 and fourth capacitor C4 included in the second Y-capacitor group 12 by connection with the capacitors Cnp, C7 and C8 connected to the neutral point of the motor 16 and the inductors L3, L4 and L5 of the motor 16.

Further, the DC voltage Vdc of the DC link may be directly applied to the first capacitor C1 and second capacitor C2 included in the first Y-capacitor group 11, and thus, the voltage of the second capacitor C2 has a value of ½ of the DC voltage Vdc. Since the voltage of the second capacitor C2 is applied to the first terminal of the switch 13 and the voltage of the fourth capacitor C4 is applied to the second terminal of the switch 13, the voltages at both the terminals of the switch 13 have different values.

Accordingly, the controller 100 may be configured to operate the switching devices S5 to S10 in the inverter 142 such that the voltages applied to the capacitors C3 and C4 of the second Y-capacitor group 12 have different values, to adjust the voltages at both the terminals of the switch 13 to different values. Thereafter, the controller 100 may be configured to output a control signal for operating the switch 13 to be open, to the switch 13, and then may be configured to measure the voltages at both the terminals of the switch 13. When the voltages at both the terminals of the switch 13 are the same, the controller 100 may be configured to determine that the switch 13 fails to be open, and thus diagnose that a closing fault has occurred in the switch 13. In addition, the controller 100 may be configured to output a control signal for operating the switch 13 to be closed, to the switch 13, and then may be configured to measure the voltages at both the terminals of the switch 13. When the voltages at both the terminals of the switch 13 are different, the controller 100 may be configured to determine that the switch 13 fails to be closed, and thus diagnose that an opening fault has occurred in the switch 13.

As described above, according to the various exemplary embodiments of the present invention, the presence/absence of a fault in the switch for the connection/disconnection of the Y-capacitors to/from the ground may be diagnosed without additionally providing separate hardware in various components applied to a high-voltage system of the vehicle. In addition, it may be possible to prevent misdiagnosis and mis-maintenance of other components caused by problems such as faulty operations of those components resulting from a fault of the switch.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A system for diagnosing switching element selectively connecting Y-capacitors to ground, comprising:
    a first Y-capacitor group including a first capacitor and a second capacitor connected in series between a positive terminal and a negative terminal of a direct current (DC) link;

a second Y-capacitor group including a third capacitor and a fourth capacitor connected in series between the positive terminal and negative terminal of the DC link;

a Y-capacitor disconnect switch having a first terminal connected to a connection node of the first capacitor and second capacitor and a second terminal connected to a connection node of the third capacitor and fourth capacitor, wherein one of the first terminal and the second terminal is connected to the ground;

a power conversion circuit connected to the DC link, the power conversion circuit including a switching device and determining a DC voltage of the DC link by on/off of the switching device; and a controller configured to adjust a state of the switching device in the power conversion circuit to form different voltages at both the terminals of the Y-capacitor disconnect switch, and then control a disconnection operation state of the Y-capacitor disconnect switch and diagnose whether a fault has occurred in the Y-capacitor disconnect switch, based on the voltages at both the terminals of the Y-capacitor disconnect switch.

2. The system according to claim 1, wherein the power conversion circuit includes a bridge circuit having a plurality of legs, each of the legs includes an upper switching device and a lower switching device connected in series, and ends of each of the legs are connected to the positive terminal and negative terminal of the DC link, respectively.

3. The system according to claim 2, wherein the controller, in a diagnosis mode of the Y-capacitor disconnect switch, is configured to operate the upper switching device and lower switching device in each of the legs of the bridge circuit to cause the upper switching device and the lower switching device to enter different states to form different voltages at the series-connected capacitors in the first Y-capacitor group or second Y-capacitor group.

4. The system according to claim 1, wherein the first Y-capacitor group is connected to an output stage of the power conversion circuit, and the first terminal of the Y-capacitor disconnect switch and the connection node of the first capacitor and second capacitor are directly connected to the ground.

5. The system according to claim 4, wherein the controller, in a diagnosis mode of the Y-capacitor disconnect switch, is configured to operate the switching device of the power conversion circuit to adjust voltages applied respectively to the first capacitor and the second capacitor to different levels.

6. The system according to claim 1, wherein the power conversion circuit is a non-isolated charger configured to convert alternating current (AC) power into DC power and provide the converted DC power as power for charging of a battery connected to the DC link, wherein the controller is configured to adjust states of a plurality of switching devices in the non-isolated charger to adjust voltages applied to the series-connected capacitors in the first or second Y-capacitor group to different levels.

7. The system according to claim 6, wherein the non-isolated charger includes:

a first switching device and a second switching device connected in series to form a first leg; and a third switching device and a fourth switching device connected in series to form a second leg, wherein a first terminal of an input stage receiving the AC power is connected to a connection node of the first switching device and second switching device, a second terminal of the input stage is connected to a connection node of the third switching device and fourth switching device, and the DC voltage is applied between a connection node of the first switching device and the third switching device and a connection node of the second switching device and the fourth switching device.

8. The system according to claim 7, further comprising:

a filter include a fifth capacitor and a sixth capacitor connected in series between both the terminals of the input stage receiving the AC power and connected to the connection node of the first capacitor and second capacitor at a connection node thereof, a first inductor connected between the first terminal of the input stage receiving the AC power and the connection node of the first switching device and second switching device;

a second inductor connected between the other terminal of the input stage receiving the AC power and the connection node of the third switching device and fourth switching device; and a DC link capacitor having a first end connected to the positive terminal of the DC link and a second end connected to the negative terminal of the DC link, wherein the controller, in a diagnosis mode of the Y-capacitor disconnect switch, is configured to operate the first switching device and third switching device to be closed and the second switching device and fourth switching device to be open, or operate the first switching device and third switching device to be open and the second switching device and fourth switching device to be closed.

9. The system according to claim 1, wherein the power conversion circuit is an inverter configured to convert the DC voltage into AC power having a plurality of phases and provide the converted AC power to respective phases of a motor, or convert a level of a DC voltage applied to a neutral point of the motor and apply the level-converted DC voltage to the DC link, wherein the controller is configured to adjust states of a plurality of switching devices in the inverter to form the different voltages at both the terminals of the Y-capacitor disconnect switch.

10. The system according to claim 9, wherein the inverter includes:

a fifth switching device and a sixth switching device connected in series to form a first leg;

a seventh switching device and an eighth switching device connected in series to form a second leg; and a ninth switching device and a tenth switching device connected in series to form a third leg, wherein one end of each of the fifth switching device, seventh switching device and ninth switching device is connected to the positive terminal and negative terminal of the DC link and one end of each of the sixth switching device, eighth switching device and tenth switching device is connected to the negative terminal of the DC link, and wherein a connection node of the fifth switching device and sixth switching device is connected to a first of the phases of the motor, a connection node of the seventh switching device and eighth switching device is connected to a second of the phases of the motor, and a connection node of the ninth switching device and tenth switching device is connected to a third of the phases of the motor.

11. The system according to claim 10, further comprising:
a neutral-point capacitor configured to apply a DC voltage of external DC power to the neutral point of the motor; and
a seventh capacitor and an eighth capacitor connected in series across the neutral-point capacitor and connected to the connection node of the third capacitor and fourth capacitor at a connection node thereof,
wherein the controller, in a diagnosis mode of the Y-capacitor disconnect switch, is configured to operate the fifth switching device, seventh switching device and ninth switching device to be closed and the sixth switching device, eighth switching device and tenth switching device to be open, or operate the fifth switching device, seventh switching device and ninth switching device to be open and the sixth switching device, eighth switching device and tenth switching device to be closed.

12. The system according to claim 1, wherein the controller, in a diagnosis mode of the Y-capacitor disconnect switch, forms the different voltages at both the terminals of the Y-capacitor disconnect switch, and is configured to:
diagnose that an opening fault has occurred in the Y-capacitor disconnect switch when the voltages at both the terminals of the Y-capacitor disconnect switch are different under the condition of providing a control signal for turning on the Y-capacitor disconnect switch, to the switch; and
diagnose that a closing fault has occurred in the Y-capacitor disconnect switch when the voltages at both the terminals of the Y-capacitor disconnect switch are the same under the condition of providing a control signal for turning off the Y-capacitor disconnect switch to be turned off.

* * * * *